United States Patent
Rahim et al.

(10) Patent No.: US 7,277,346 B1
(45) Date of Patent: Oct. 2, 2007

(54) METHOD AND SYSTEM FOR HARD FAILURE REPAIRS IN THE FIELD

(75) Inventors: Irfan Rahim, San Jose, CA (US); Peter J. McElheny, Morgan Hill, CA (US); Eric Choong-Yin Chang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/012,877

(22) Filed: Dec. 14, 2004

(51) Int. Cl.
*G11C 17/18* (2006.01)
(52) U.S. Cl. .................. 365/225.7; 326/39; 326/10; 326/12; 326/13; 365/200; 365/201; 365/185.09
(58) Field of Classification Search ............... 326/10, 326/12, 13, 39; 365/225.7, 185.09, 200, 365/201
See application file for complete search history.

(56) References Cited

U.S. PATENT DOCUMENTS

| | | | |
|---|---|---|---|
| 4,281,398 A * | 7/1981 | McKenny et al. .......... 365/200 |
| 4,446,534 A * | 5/1984 | Smith ......................... 365/96 |
| 4,899,067 A | 2/1990 | So et al. |
| 5,260,611 A | 11/1993 | Cliff et al. |
| 5,301,159 A * | 4/1994 | Lee ........................ 365/225.7 |
| 5,369,314 A | 11/1994 | Patel et al. |
| 5,434,514 A | 7/1995 | Cliff et al. |
| 5,592,102 A | 1/1997 | Lane et al. |
| 5,926,036 A | 7/1999 | Cliff et al. |
| 6,034,536 A | 3/2000 | McClintock et al. |
| 6,101,624 A | 8/2000 | Cheng et al. |
| 6,107,820 A | 8/2000 | Jefferson et al. |
| 6,167,558 A | 12/2000 | Trimberger |
| 6,201,404 B1 | 3/2001 | Reddy et al. |
| 6,344,755 B1 | 2/2002 | Reddy et al. |
| 6,600,337 B2 | 7/2003 | Nguyen et al. |
| 6,605,962 B2 | 8/2003 | Lee et al. |
| 6,630,842 B1 | 10/2003 | Lewis et al. |
| 6,653,862 B2 | 11/2003 | Johnson et al. |
| 6,768,694 B2 * | 7/2004 | Anand et al. ............ 365/225.7 |
| 6,774,672 B1 | 8/2004 | Lien et al. |
| 2001/0006347 A1 | 7/2001 | Jefferson et al. |
| 2002/0166106 A1 | 11/2002 | Lewis et al. |
| 2003/0072185 A1 | 4/2003 | Lane et al. |
| 2003/0179616 A1* | 9/2003 | Wohlfahrt et al. .......... 365/200 |

OTHER PUBLICATIONS

Betz et al., Architecture and CAD for Deep-Submicron FPGAs, 1999, pp. 11-18, 63-103, 105-126, 151-190.

* cited by examiner

*Primary Examiner*—Richard T. Elms
*Assistant Examiner*—Eric Wendler
(74) *Attorney, Agent, or Firm*—Townsend and Townsend and Crew LLP

(57) ABSTRACT

A semiconductor system and method for repairing failures of a packaged integrated circuit system are provided. The method includes detecting a failure associated with a packaged integrated circuit system after the packaged integrated circuit system is packaged, and repairing the failure by activating a redundancy circuit in the packaged integrated circuit system and deactivating a defective circuit associated with the failure. The process for repairing the failure includes applying a repair voltage to a polysilicon fuse to change a conductivity state of the polysilicon fuse from a first state to a second state. In another embodiment, the polysilicon fuse is replaced by a metal fuse, an anti-fuse, or a non-volatile random access memory.

4 Claims, 6 Drawing Sheets

METHOD AND SYSTEM FOR HARD FAILURE REPAIRS IN THE FIELD

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates generally to failure repairs for electronic systems. More specifically, the invention provides a method and system for repairing hard failures in the field. Merely by way of example, the invention has been applied to integrated circuits such as field-programmable gate arrays (FPGAs), but it would be recognized that the invention has a much broader range of applicability.

Integrated circuits (ICs) usually include millions of devices. The large number of devices has significantly improved circuit complexity. Additionally, the feature size of the smallest devices has been reduced in order to improve circuit density. High circuit complexity and density can enhance IC performance, but have also posed significant challenges to quality and reliability control.

To improve circuit quality, ICs are usually tested prior to packaging. One type of IC is FPGAs. Faults related to FPGAs can be detected by a Built-In Self-Test (BIST). Upon fault identifications, laser beams may be used to change connection status of certain fuses or anti-fuses, and thus activate redundancy devices in order to replace defective devices. But the laser beams are usually difficult to maintain and to operate.

After ICs have been put into use, certain tests are also performed to monitor the circuit performance. For example, error correction codes (ECCs) can be used to identify soft errors. Soft errors usually result from neutron or alpha particle radiation. Upon detections of soft errors, certain programmable logic elements are reprogrammed according to the desired configuration. Error correction codes by themselves cannot effectively repair hard failures.

Hence it is desirable to improve techniques for repairing hard failures.

BRIEF SUMMARY OF THE INVENTION

The present invention relates generally to failure repairs for electronic systems. More specifically, the invention provides a method and system for repairing hard failures in the field. Merely by way of example, the invention has been applied to integrated circuits such as FPGAs, but it would be recognized that the invention has a much broader range of applicability.

An embodiment of the present invention provides a method for repairing failures of a packaged integrated circuit system. The method includes detecting a failure associated with the packaged integrated circuit system and repairing the detected failure by activating a redundancy circuit and deactivating a defective circuit associated with the failure. The repair of the failure includes applying a voltage to a polysilicon fuse and changing the conductivity state of the polysilicon fuse.

Many benefits are achieved by way of the present invention over conventional techniques. For example, certain embodiments of the present invention provide self-healing systems that can detect failures and repair such failures by themselves. Some embodiments of the present invention enables failure detection and repair in the field. For example, a failure is detected and repaired in the field. Certain embodiments of the present invention provide efficient and continuous monitoring of system reliability. For example, the monitoring is performed by tested systems without or with limited interaction with external systems. Some embodiments of the present invention provide repairs of hard failures. For example, the repairs are performed without or with limited interaction with external systems. As another example, the repairs are performed with a repair voltage less than or equal to an operation voltage used by the system under test. For example, the repair voltage equals about 3.3 volts. Certain embodiments of the present invention use polysilicon fuses in tested systems. For example, the tested systems implement FPGA architectures. Some embodiments of the present invention use redundancy in tested systems. Certain embodiments of the present invention use error correction codes implemented in tested systems. Some embodiments of the present invention improve system reliability. For example, test systems have a large number of transistors and/or interconnects. The transistors may have a feature size that has become smaller with each generation of integrated circuits. The interconnects may include numerous single vias. The decreasing size and the increasing number of devices and/or interconnects pose a significant challenge to system reliability and repair. In another example, copper interconnects may suffer from via pull back which is a time dependent phenomena. Some embodiments of the present invention can significantly reduce system failure rate, such as the failure rate for $10^9$ device hours (FIT).

Depending upon embodiment, one or more of these benefits may be achieved. These benefits and various additional objects, features and advantages of the present invention can be fully appreciated with reference to the detailed description and accompanying drawings that follow.

DETAILED DESCRIPTION OF THE INVENTION

The present invention relates generally to failure repairs for electronic systems. More specifically, the invention provides a method and system for repairing hard failures in the field. Merely by way of example, the invention has been applied to integrated circuits such as FPGAs, but it would be recognized that the invention has a much broader range of applicability.

Figure 1:
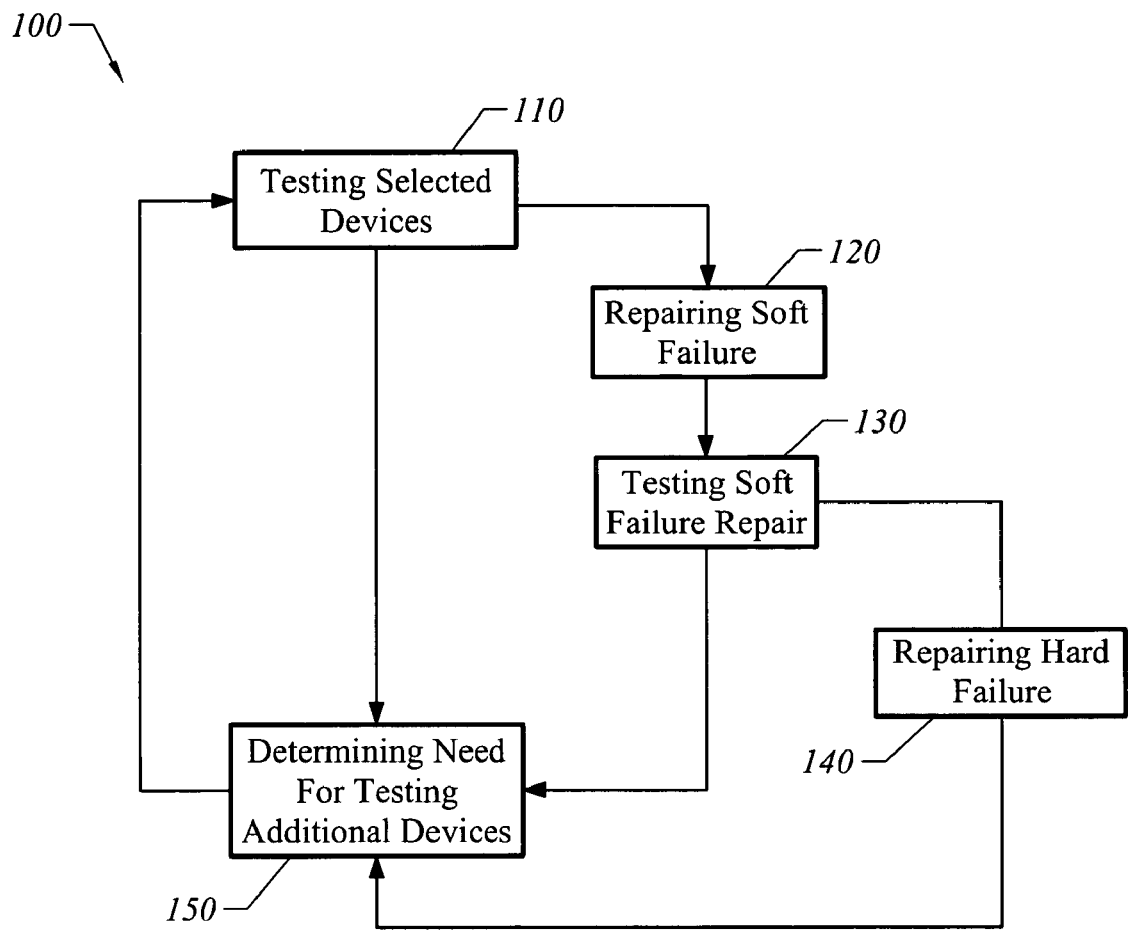
FIG. 1 is a simplified method for repairing failures according to an embodiment of the present invention.

FIG. 1 is a simplified method for repairing failures according to an embodiment of the present invention. This diagram is merely an example, which should not unduly limit the scope of the claims herein. The method 100 includes process 110 for testing selected devices, process 120 for repairing soft failure, process 130 for testing soft failure repair, process 140 for repairing hard failure, and process 150 for determining need for testing additional devices. Although the above has been shown using a selected sequence of processes, there can be many alternatives, modifications, and variations. For example, some of the processes may be expanded and/or combined. Processes 120 and 130 or process 130 may be skipped. Other processes may be inserted to those noted above. Depending upon the embodiment, the specific sequences of processes may be interchanged with others replaced. Further details of these processes are found throughout the present specification and more particularly below.

At the process 110, selected devices are tested for failures. For example, the selected devices refer to a single device, a row of single devices, a column of single devices, a block of single devices, or a circuit including a plurality of single devices. In another example, the selected devices are part of a FPGA chip. In one embodiment, the testing is performed with an error correction code (ECC). ECC uses math functions to calculate a small signature based on actual values of numerous bits under test. For example, a math function is used to XOR every other bit, and a 1,000-bit row results in a 16-bit signature. If the signature is different from the reference number, a failure is detected and the process 120 is performed. The reference number is determined based on expected values of the bits sampled and may be stored in memory. If the signature calculated is the same as the reference number, no failure is detected. The process 150 is then performed.

At the process 120, a repair for soft failure is performed. In one embodiment, a device can be set into one of several allowable states. A soft failure is a failure to set a device into the desired state. A soft failure can be corrected by resetting the device to the desired state, and such resetting can be accomplished with ECC. At the process 120, the failure detected at the process 110 is presumed as a soft failure and repaired.

At the process 130, the soft failure repair is tested. ECC samples the selected bits related to the soft failure repair and calculates a small signature based on actual values of these bits. If the signature calculated is the same as a reference number based on expected values of the bits sampled, the soft failure repair is determined successful. The process 150 is performed. If the signature is different from the reference number, the soft failure repair is determined unsuccessful. The failure detected at the process 110 is considered as a hard failure, and the process 140 is performed.

At the process 140, a hard failure is repaired. In one embodiment, a hard failure results from a defective device that cannot be fixed by resetting the device. For example, a hard failure results from a via pull back. In another embodiment, a hard failure can be repaired by replacing a defective device with a redundant and functional device. For example, the defective device refers to a defective circuit, a defective row, or a defective column, and the redundant device refers to a redundant circuit, a redundant row, or a redundant column. In another embodiment, the replacement can be accomplished by deactivating the defective device and activating the redundant device. The deactivation and activation are implemented with changing connection status of a switch associated with the defective device and/or the redundant device. For example, the switch is a fuse or anti-fuse. In one embodiment, after the hard failure repair, the process 150 is performed.

At the process 150, whether additional devices should be tested is determined. In one embodiment, other devices in the same system needs to be tested. For example, the testing is performed row by row or column by column. In another embodiment, the system should be tested again automatically after a predetermined intermission. In yet another embodiment, the system should be tested again upon receipt of a triggering signal.

Figure 2:
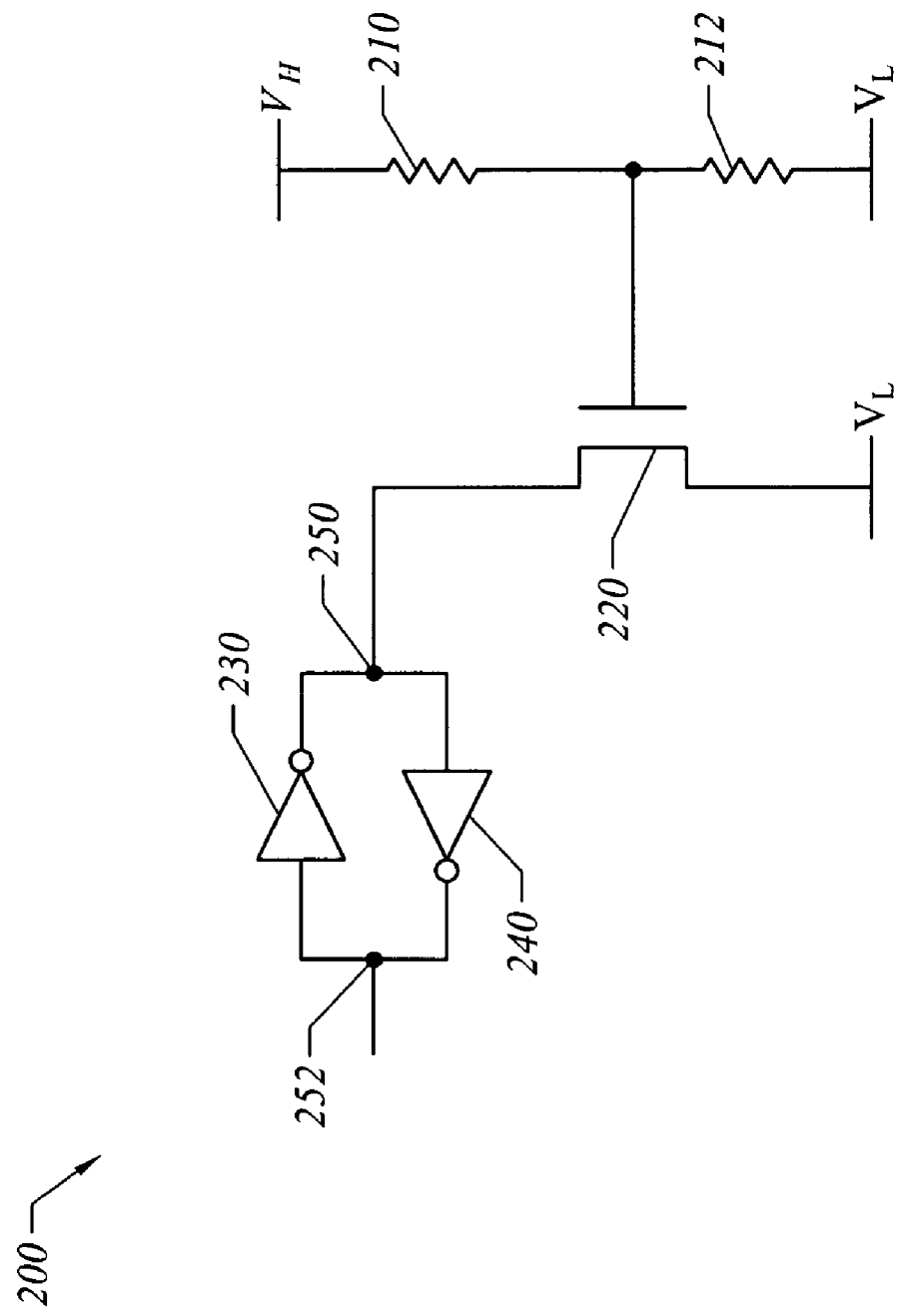
FIG. 2 is a simplified fuse system used according to an embodiment of the present invention.

FIG. 2 is a simplified fuse system used in the process 140 according to an embodiment of the present invention. This diagram is merely an example, which should not unduly limit the scope of the claims herein. The fuse system 200 includes fuses 210 and 212, a transistor 220, and inverters 220 and 230. Although the above has been shown using a selected group of components, there can be many alternatives, modifications, and variations. Depending upon the embodiment, the specific arrangements of components may be interchanged with others replaced. Further details of these components are found throughout the present specification and more particularly below.

In one embodiment, the fuse 210 is coupled to $V_H$, the fuse 212 is coupled to $V_L$, and the transistor 220 is coupled to $V_L$. In another embodiment, the fuses 210 and 212 are made of polysilicon. Prior to the process 140, the fuse 210 has a resistance significantly lower than that of the fuse 212. For example, the resistance of the fuse 210 is about 100Ω, and the resistance of the fuse 212 is about 1000Ω. At the process 140, the polysilicon fuse 210 is opened. Consequently, the resistance of the polysilicon fuse 210 becomes significantly larger than that of the fuse 212. For example, the resistance of the polysilicon fuse 210 increases from about 100Ω to about 10 kΩ, and the resistance of the polysilicon fuse 212 remains equal to about 1000Ω. As another example, a repair voltage is applied across the polysilicon fuse 210, and the resulting current generates sufficient heat to melt the polysilicon fuse 210. In one embodiment, the repair voltage is an operation voltage used by the system under test. For example, the repair voltage is less than or equal to about 3.3 volts. In yet another example, $V_H$ is equal to $V_{cc}$, and $V_L$ is equal to $V_{ss}$.

Figure 3:
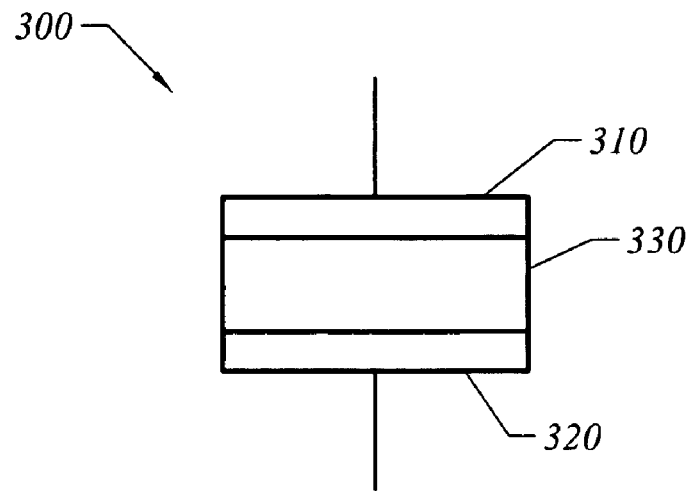
FIG. 3 is a simplified anti-fuse system used according to another embodiment of the present invention.

FIG. 3 is a simplified anti-fuse system used in the process 140 according to another embodiment of the present invention. This diagram is merely an example, which should not unduly limit the scope of the claims herein. The anti-fuse system 300 includes conductive electrodes 310 and 320, which are separated by a dielectric layer 330. Although the above has been shown using a selected group of components, there can be many alternatives, modifications, and variations. Depending upon the embodiment, the specific arrangements of components may be interchanged with others replaced. Further details of these components are found throughout the present specification and more particularly below.

In one embodiment, the dielectric layer 330 is made of silicon oxide. The thickness of the dielectric layer 330 ranges from 15 A to 70 A. Prior to the process 140, the anti-fuse system 300 forms an open connection. At the process 140, the anti-fuse system 300 is shorted. For example, a repair voltage is applied to the dielectric layer 330, and the dielectric layer is broken down. The current can flow between the electrodes 310 and 320 with low resistance. In one embodiment, the repair voltage is higher than a supply voltage used by the system under test. A voltage booster can convert the supply voltage to the repair voltage. For example, the repair voltage ranges from 1V to 5V.

As discussed above and further emphasized here, FIGS. 1-3 are merely examples, which should not unduly limit the scope of the claims herein. One of ordinary skill in the art would recognize many variations, modifications, and alternatives. For example, the method 100 for repairing failures can be implemented in a packaged integrated circuit chip. As another example, the method 100 is implemented in a FPGA chip. In yet another example, at the process 140, the switch is a fuse or anti-fuse. In one embodiment, the fuse is a metal fuse. In yet another example, the switch includes a non-volatile random access memory.

Figure 4:
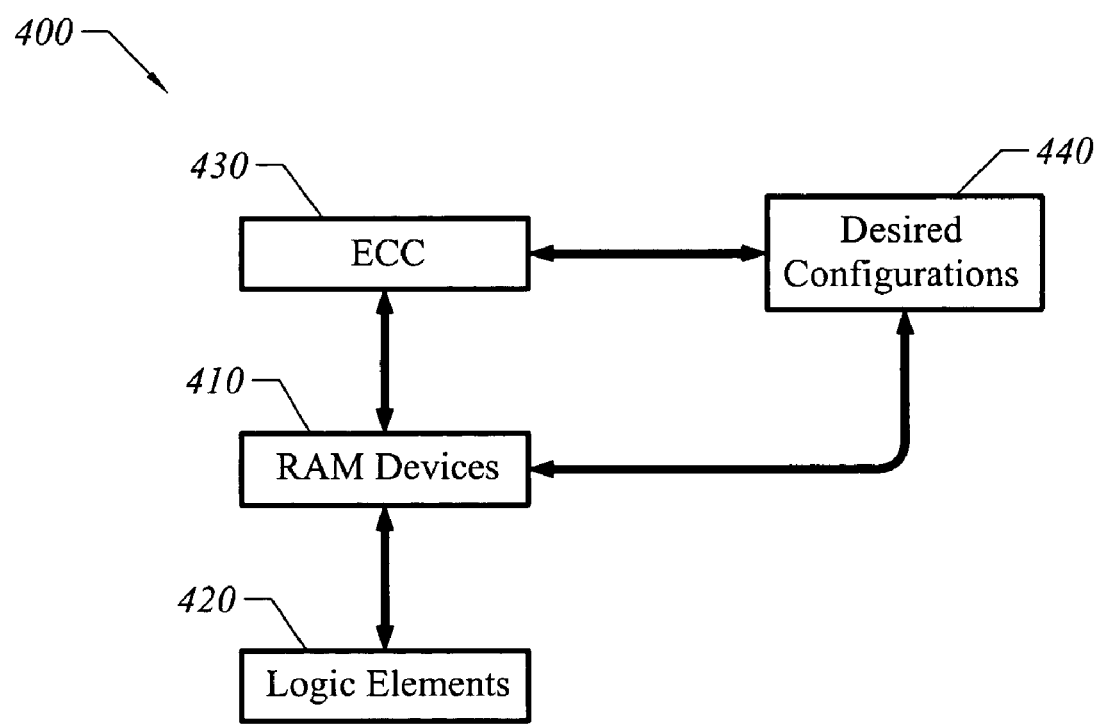
FIG. 4 is a simplified self-repair system according to an embodiment of the present invention.

FIG. 4 is a simplified self-repair system according to an embodiment of the present invention. This diagram is merely an example, which should not unduly limit the scope of the claims herein. The system 400 includes random access memory (RAM) devices 410, logic elements 420, a controller 430, and a flash memory 440. Although the above has been shown using a selected group of components, there can be many alternatives, modifications, and variations. For example, the RAM devices 410 have a distributed configuration including memory blocks of varying sizes. As another example, the system 400 is a packaged integrated circuit chip. Depending upon the embodiment, the specific arrangements of components may be interchanged with others replaced. Further details of these components are found throughout the present specification and more particularly below.

The flash memory 440 stores desired configurations for RAM devices 410. For example, the configurations are provided by customers and specify whether each RAM bit should be set at "0" or "1." In another example, the RAM devices 410 are static random access memory (SRAM) devices. The controller stores an error correction code and issues instructions for performing the processes 110, 120, 130 and 140. The RAM devices 410 are used to program the logic elements 420. For example, certain logic elements may be programmed to form a NAND gate or a OR gate. In one embodiment, the desired configurations are read from the flash memory 440 into the RAM devices 410 and the controller 430.

At the process 110, the controller 430 samples certain bits in the RAM devices 410 and calculates a signature based on actual states of sampled bits. The calculated signature is compared with a reference number. The reference number is determined based on desired states as specified in the configurations from the flash memory 440. If the signature calculated is the same as a reference number, no failure is detected. The process 150 is performed. If the signature is different from the reference number, a failure is detected and the process 120 is performed. For example, the failure is associated with a row of RAM devices.

At the process 120, the failure detected at the process 110 is presumed as a soft failure. In one embodiment, ECC stored in the controller 430 reprograms the RAM devices associated with the failure and thereby fix the soft failure. At the process 130, the soft failure repair is tested. For example, ECC stored in the controller 430 samples the RAM devices related to the soft failure repair and calculates a small signature based on actual values of these bits. If the signature calculated is the same as a reference number, the soft failure repair is determined successful. The process 150 is performed. If the signature is different from the reference number, the soft failure repair is determined unsuccessful. The failure detected at the process 110 is considered as a hard failure, and the process 140 is performed.

At the process 140, the hard failure is repaired by replacing a defective device with a redundant and functional device. In one embodiment, the defective device and the redundant and functional device are controlled by a switch. For example, the switch is a fuse or an anti-fuse as shown in FIGS. 2 and 3. The switch is associated with a voltage supply circuit that provides a repair voltage to the switch. In another embodiment, redundancy in the RAM devices 410 uses spare rows or columns. For example, the RAM 410 has 20 normal rows and 1 spare row at the bottom of the 20 rows. If a defect falls on any of the 20 rows, and that defect is detected by ECC, the FPGA chip can be repaired by shifting the use of the defective row to the use of the spare row. In one embodiment, only the defective row is shifted to the spare row. In another embodiment, the defective row and all rows below the defective row are shifted respectively to rows immediately below them. To remember what row is repaired on any given chip, there are many ways. Some use physical changes to the die such as blowing metal, polysilicon fuse, or anti-fuse, and others use non-physical changes such as logic that figures out which row to repair automatically.

At the process 150, whether additional devices should be tested is determined. In one embodiment, another row or column of memory devices need to be tested. In another embodiment, the system should be tested again automatically after a predetermined intermission. In yet another embodiment, the system should be tested again upon receipt of a triggering signal. For example, the system 400 is a FPGA chip which is a component of another system. This system includes a controller that provides a triggering signal for testing the FPGA chip.

Figure 5:
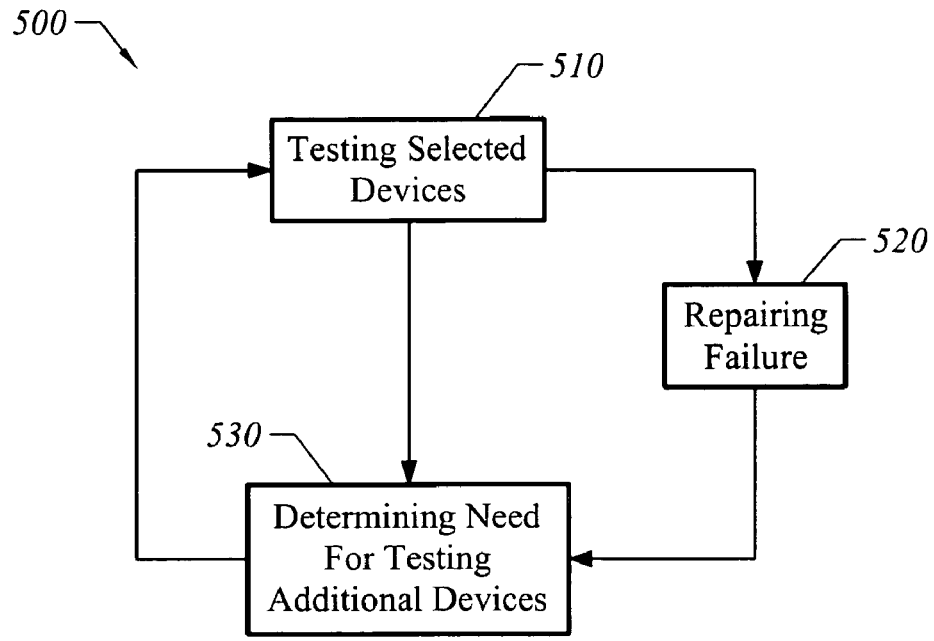
FIG. 5 is a simplified method for repairing failures according to another embodiment of the present invention.

FIG. 5 is a simplified method for repairing failures according to another embodiment of the present invention. This diagram is merely an example, which should not unduly limit the scope of the claims herein. The method 500 includes process 510 for testing selected devices, process 520 for repairing failure, and process 530 for determining need for testing additional devices. Although the above has been shown using a selected sequence of processes, there can be many alternatives, modifications, and variations. For example, some of the processes may be expanded, combined, and/or skipped. Other processes may be inserted to those noted above. Depending upon the embodiment, the specific sequences of processes may be interchanged with others replaced. Further details of these processes are found throughout the present specification and more particularly below.

At the process 510, selected devices of a system are tested. For example, the selected devices refer to a single device, a row of single devices, a column of single devices, a block of single devices, or a circuit including a plurality of single devices. In one embodiment, the testing uses a built-in self-test (BIST) method. For example, a BIST circuit is implemented as part of a packaged integrated circuit system, and allows testing various parts of the system without or with limited interfacing to an external tester. A BIST circuit can be simple or complicated and vary greatly depending on the system being tested. For example, a part of the system under test has a desired logic relationship between inputs and outputs. The BIST circuit can flag a logic failure from a defect. In one embodiment, if the flag is "1", the BIST signals a defect in the tested system. If a failure is detected, the process 520 is performed. If no failure is detected, the process 530 is performed.

At the process 520, a circuit failure is repaired. For example, a circuit failure results from a via pull back. In one embodiment, the circuit failure can be repaired by replacing a defective device with a redundant and functional device. For example, the defective device refers to a defective circuit or a defective row, and the redundant device refers to a redundant circuit or a redundant row. In another embodiment, the replacement can be accomplished by deactivating the defective device and activating the redundant device. The deactivation and activation are implemented by changing the connection status of a switch associated with the defective device and/or the redundant device. For example, the switch is a fuse or anti-fuse, as shown for example in FIGS. 2 and 3. After the circuit failure is repaired, the process 530 is performed.

At the process 530, whether additional devices should be tested is determined. For example, other devices in the same system needs to be tested. In another example, the system should be tested again automatically after a predetermined intermission. In yet another example, the system should be tested again upon receipt of a triggering signal.

As discussed above and further emphasized here, FIGS. 2, 3 and 5 are merely examples, which should not unduly limit the scope of the claims herein. One of ordinary skill in the art would recognize many variations, modifications, and alternatives. For example, the method 100 for repairing failures can be implemented in a packaged integrated circuit chip. As another example, the method 100 is implemented in a FPGA chip.

Figure 6:
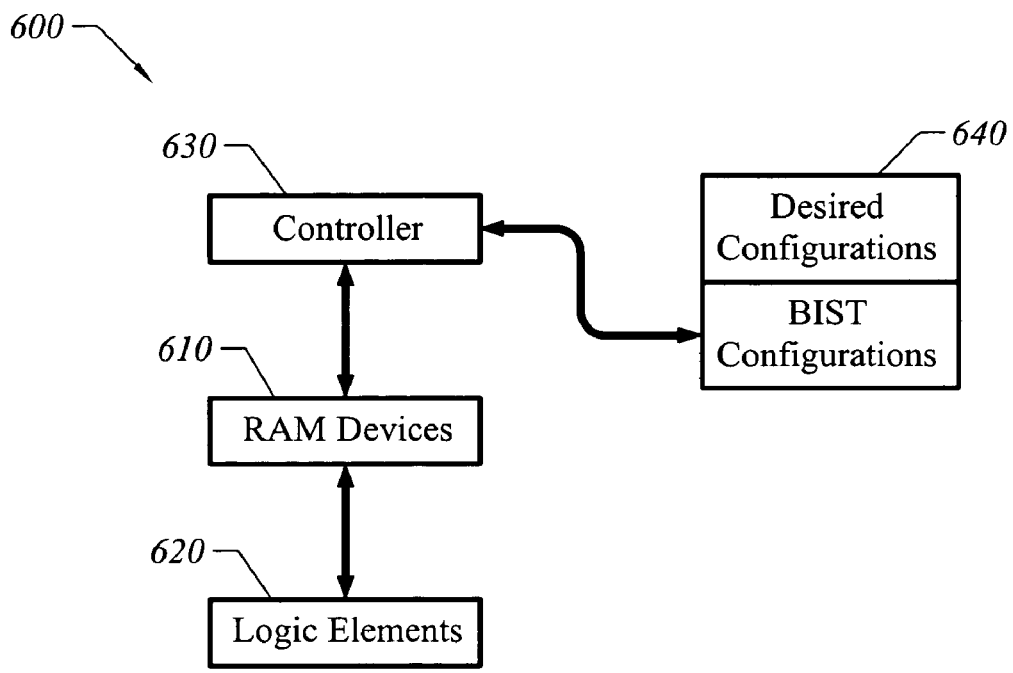
FIG. 6 is a simplified self-repair system according to another embodiment of the present invention.

FIG. 6 is a simplified self-repair system according to another embodiment of the present invention. This diagram is merely an example, which should not unduly limit the scope of the claims herein. The system 600 includes random access memory (RAM) devices 610, logic elements 620, a controller 630, and a flash memory 640. Although the above has been shown using a selected group of components, there can be many alternatives, modifications, and variations. For example, the RAM devices 610 have a distributed configuration including memory blocks of varying sizes. As another example, the system 600 is a packaged integrated circuit chip. Depending upon the embodiment, the specific arrangements of components may be interchanged with others replaced. Further details of these components are found throughout the present specification and more particularly below.

The flash memory 640 stores desired configurations and BIST configurations for RAM devices 610. For example, the configurations each specify whether each RAM bit should be set at "0" or "1." The controller issues instructions for performing the processes 510, 520, and 530. In another example, the RAM devices 610 are static random access memory (SRAM) devices. The RAM devices 610 are used to program the logic elements 620. For example, certain logic elements may be programmed to form a NAND gate or a OR gate.

At the process 510, selected devices of the system 600 are tested. For example, the selected devices may be memory and/or logic devices, and refer to a single device, a row of single devices, a column of single devices, a block of single devices, or a circuit including a plurality of single devices. In one embodiment, the testing uses a BIST method. For example, the BIST method includes receiving BIST configurations by the controller 630 from the flash memory 640, programming the selected devices according to the BIST configurations, and testing the programmed selected devices. The test of the programmed, selected devices includes providing an input to the selected devices, detecting an output from the selected devices, and comparing the detected output with a desired output. The desired output is determined based on the input and the BIST configurations. If the detected output is the same as the desired output, the process 530 is performed. If the detected output is different from the desired output, the process 520 is performed.

At the process 520, the circuit failure is repaired by replacing a defective device with a redundant and functional device. In one embodiment, the defective device and the redundant and functional device each is controlled by a switch. For example, the switch is a fuse or an anti-fuse as shown in FIGS. 2 and 3. The switch is associated with a voltage supply circuit that provides a repair voltage to the switch. In another embodiment, redundancy in the RAM devices 610 and/or the logic elements 620 use spare rows or columns. For example, the RAM devices 610 or the logic elements 620 have 20 normal rows and 1 spare row at the bottom of the 20 rows. If a defect falls on any of the 20 rows, and that defect is detected by BIST, the FPGA chip can be repaired by shifting the use of the defective row to the use of the spare row. In one embodiment, only the defective row is shifted to the spare row. In another embodiment, the defective row and all rows below the defective row are shifted respectively to rows immediately below them. To remember what row is repaired on any given chip, there are many ways. Some use physical changes to the die such as blowing metal, polysilicon fuse, or anti-fuse, and others use non-physical changes such as logic that figures out which row to repair automatically. In yet another embodiment, redundancy circuitry described in U.S. Pat. No. 6,034,536 is used. U.S. Pat. No. 6,034,536 is incorporated by reference.

At the process 530, whether additional devices should be tested is determined. In one embodiment, another row or column of memory and/or logic devices needs to be tested. In another embodiment, the system should be tested automatically after a predetermined intermission. In yet another embodiment, the system should be tested upon receipt of a triggering signal. For example, the system 600 is a FPGA chip which is a component of another system. The another system includes a controller providing a triggering signal for testing the FPGA chip.

As discussed above and further emphasized here, FIGS. 1-6 are merely examples, which should not unduly limit the scope of the claims herein. One of ordinary skill in the art would recognize many variations, alternatives, and modifications. For example, the process 110 and/or the process 510 for testing selected devices is performed after the selected devices are packaged. As another example, the process 140 for repairing hard failure and/or the process 520 for repairing failure is performed in the field. In one embodiment, the process 140 and/or 520 is performed in the user environment. In another embodiment, the process 140 and/or 520 is performed after the devices have been delivered to the user without being returned to the manufacturer of such devices. In yet another embodiment, the process 140 and/or 520 is performed without opening the semiconductor package encapsulating the tested devices.

Figure 7:
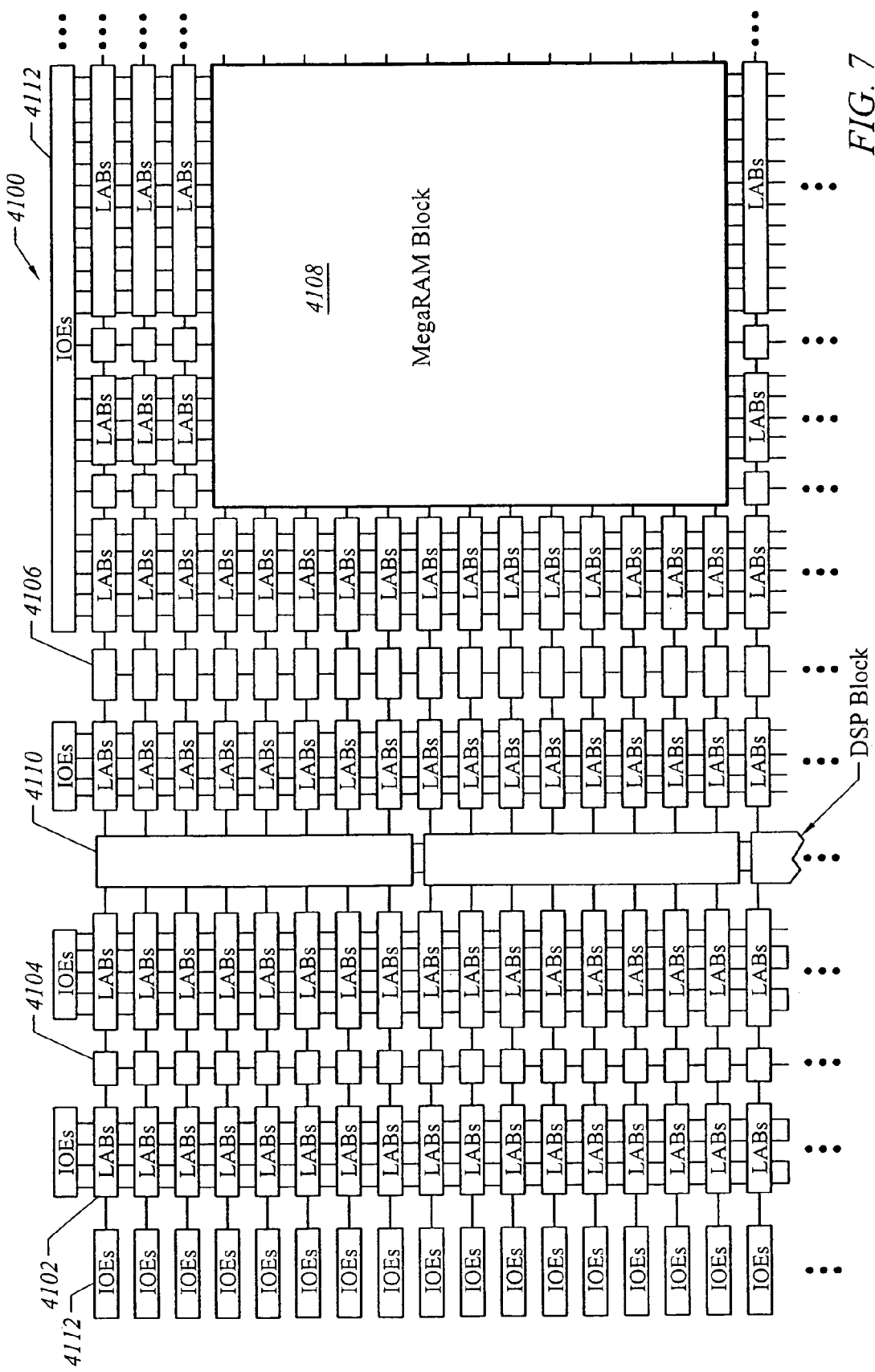
FIG. 7 is a simplified partial block diagram of an exemplary high-density programmable logic device.

The present invention has various applications. Certain embodiments of the present invention provide failure repairs to integrated circuit systems. For example, some embodiments of the present invention provide failure repairs to programmable logic devices. FIG. 7 is a simplified partial block diagram of an exemplary high-density programmable logic device (PLD) 4100 wherein techniques according to the present invention can be utilized. The PLD 4100 includes a two-dimensional array of programmable logic array blocks (LABs) 4102 that are interconnected by a network of column and row interconnections of varying length and speed. The LABs 4102 include multiple (e.g., 10) logic elements (LEs), an LE being a small unit of logic that provides for efficient implementation of user defined logic functions.

The PLD 4100 also includes a distributed memory structure including RAM blocks of varying sizes provided throughout the array. The RAM blocks include, for example, 512 bit blocks 4104, 4 K blocks 4106 and an M-Block 4108 providing 512 K bits of RAM. These memory blocks may also include shift registers and FIFO buffers. The PLD 4100 further includes digital signal processing (DSP) blocks 4110 that can implement, for example, multipliers with add or subtract features.

It is to be understood that the PLD 4100 is described herein for illustrative purposes only and that the present invention can be implemented in many different types of PLDs, FPGAs, and the other types of digital integrated circuits.

Figure 8:
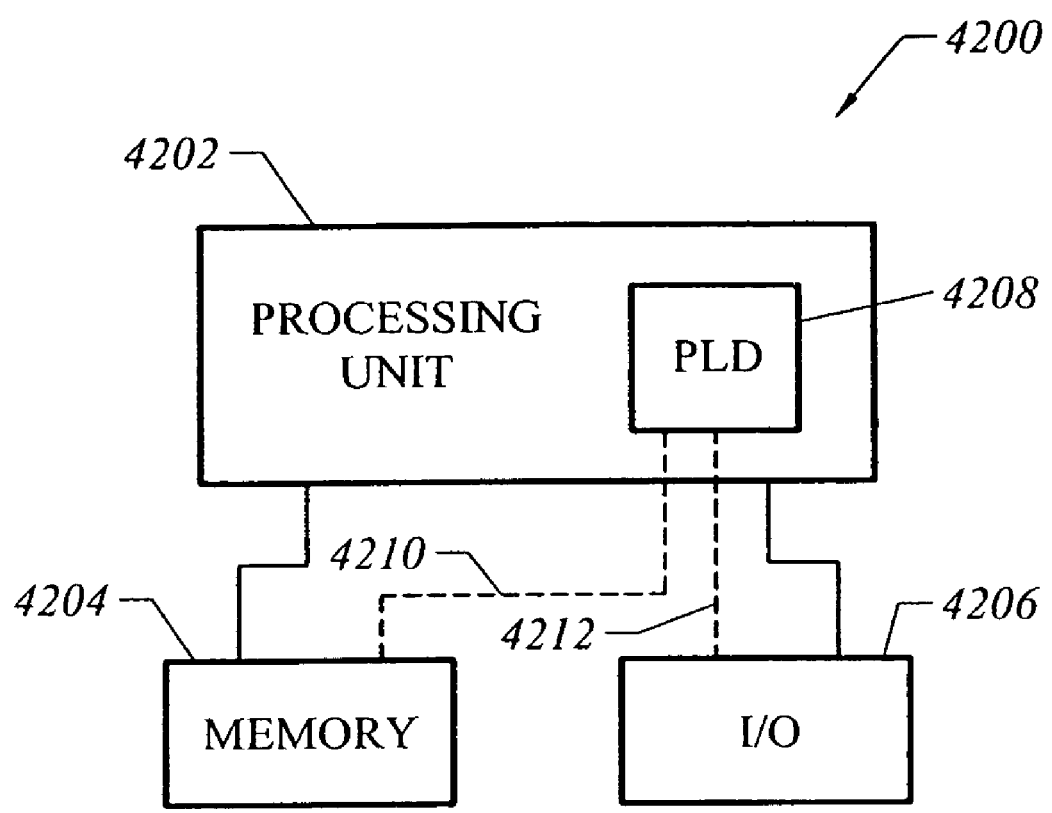
FIG. 8 shows a block diagram of an exemplary digital system.

While the PLDs of the type shown in FIG. 7 provide many of the resources required to implement system level solutions, the present invention can also benefit systems wherein a PLD is one of several components. FIG. 8 shows a block diagram of an exemplary digital system 4200, within which the present invention may be embodied. The system 4200 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, the system 4200 may be provided on a single board, on multiple boards, or within multiple enclosures.

The system 4200 includes a processing unit 4202, a memory unit 4204 and an I/O unit 4206 interconnected together by one or more buses. According to this exemplary embodiment, a programmable logic device (PLD) 4208 is embedded in the processing unit 4202. The PLD 4208 may serve many different purposes within the system in FIG. 8. The PLD 4208 can, for example, be a logical building block of the processing unit 4202, supporting its internal and external operations. The PLD 4208 is programmed to implement the logical functions necessary to carry on its particular role in system operation. The PLD 4208 may be specially coupled to the memory unit 4204 through connection 4210 and to the I/O unit 4206 through connection 4212.

The processing unit 4202 may direct data to an appropriate system component for processing or storage, execute a program stored in the memory 4204 or receive and transmit data via the I/O unit 4206, or other similar function. The processing unit 4202 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more of the PLD 4208 can control the logical operations of the system. In an embodiment, the PLD 4208 acts as a reconfigurable processor, which can be reprogrammed as needed to handle a particular computing task. Alternately, the programmable logic device 4208 may itself include an embedded microprocessor. The memory unit 4204 may be a random access memory (RAM), read only memory (ROM), fixed or flexible disk media, PC Card flash disk memory, tape, or any other storage means, or any combination of these storage means.

According to an embodiment of the present invention, the method for repairing failures of a packaged integrated circuit system includes detecting a failure associated with a packaged integrated circuit system. Additionally, the method includes repairing the failure by activating a redundancy circuit in the packaged integrated circuit system and deactivating a defective circuit associated with the failure. Repairing the failure includes changing a conductivity state of a polysilicon fuse from a first state to a second state. Changing the polysilicon fuse, moreover, includes applying a repair voltage to the polysilicon fuse.

According to another embodiment of the present invention, the method for repairing failures of a packaged integrated circuit system includes detecting a failure associated with the device of a packaged integrated circuit system. Additionally, the method includes programming the device to a predetermined state, measuring at least an actual state associated with the device, processing information associated with the actual state and the predetermined state, and repairing the failure by activating a redundancy circuit in the packaged integrated circuit system and deactivating a defective circuit associated with the failure. Detecting such failures includes performing a test based on information associated with an error correction code. Repairing the failure includes changing a connectivity state of a switch and changing the connectivity state, moreover, includes applying a repair voltage to the switch.

According to yet another embodiment of the present invention, the method for repairing failures of a packaged integrated circuit system includes detecting a failure associated with a device of a packaged integrated circuit system. Additionally, the method includes repairing the failure by activating a redundancy circuit in the packaged integrated circuit system and deactivating a defective circuit associated with the failure. Detecting such failures includes performing a built-in self-test based on information associated with a test configuration that is stored in a memory of the packaged integrated circuit system. Repairing such failures includes changing a connectivity state of a switch and changing the connectivity state, moreover, includes applying a repair voltage to the switch.

According to yet another embodiment of the present invention, a self-repair system for integrated circuits includes a plurality of programmable logic devices, a plurality of random access memory devices associated with the plurality of programmable logic devices, a redundant circuit associated with a polysilicon fuse, and a controller that stores information associated with an error correction code. The controller is further configured to provide one or more instructions for detecting a failure associated with one or more of the plurality of programmable logic devices. Additionally, the controller is configured to provide one or more instructions for programming these devices to a predetermined state, one or more instructions for measuring an actual state associated with these devices, one or more instructions for processing information associated with the actual state and the predetermined state, and one or more instructions for repairing the failure by activating a redundancy circuit in the packaged integrated circuit system and deactivating a defective circuit associated with the failure.

According to yet another embodiment of the present invention, a self-repair system for integrated circuits includes a plurality of programmable logic devices, a plurality of random access memory devices associated with the plurality of programmable logic devices, a redundant circuit associated with a polysilicon fuse, and a memory storing information associated with an operation configuration for the plurality of programmable logic devices and a test configuration for built-in self-tests. Additionally the system includes a controller configured to receive information associated with the test configuration for built-in self-tests from the memory and to provide one or more instructions for detecting a failure associated with one of the plurality of programmable logic devices or one of the plurality of random access memory devices. Additionally, the controller is configured to provide one or more instructions for repairing the failure by activating a redundancy circuit and deactivating a defective circuit associated with the failure.

The present invention has various advantages. Certain embodiments of the present invention provide self-healing systems that can detect failures and repair such failures by themselves. Some embodiments of the present invention enables failure detection and repair in the field. For example, a failure is detected and repaired in the field. Certain embodiments of the present invention provide efficient and continuous monitoring of system reliability. For example, the monitoring is performed by tested systems without or with limited interaction with external systems. Some embodiments of the present invention provide repairs of hard failures. For example, the repairs are performed without or with limited interaction with external systems. As another example, the repairs are performed with a repair voltage less than or equal to an operation voltage used by the system under test. For example, the repair voltage equals about 3.3 volts. Certain embodiments of the present invention use polysilicon fuses in tested systems, which might, for example, implement FPGA architectures. Some embodiments of the present invention use redundancy in tested systems. Certain embodiments of the present invention use error correction codes implemented in tested systems. Some embodiments of the present invention improve system reliability. For example, test systems have a large number of transistors and/or interconnects. The transistors may have a feature size that has become smaller with each generation of integrated circuits. The interconnects may include numerous single vias. The decreasing size and the increasing number of devices and/or interconnects pose significant challenge to system reliability and repair. In another example, copper interconnects may suffer from via pull back which is a time dependent phenomena. Some embodiments of the present invention can significantly reduce system failure rate, such as the failure rate for 109 device hours (FIT).

It is understood the examples and embodiments described herein are for illustrative purposes only and that various modifications or changes in light thereof will be suggested to persons skilled in the art and are to be included within the spirit and purview of this application and scope of the appended claims.

What is claimed is:

1. A method for repairing failures of a packaged integrated circuit system, the method comprising:

providing a packaged integrated circuit system, the packaged integrated circuit system including a plurality of programmable logic devices, a plurality of random access memory devices associated with the plurality of programmable logic devices, a redundant circuit associated with a polysilicon fuse, a memory configured to store information associated with an operation configuration for the plurality of programmable logic devices and a test configuration for built-in self-test, and a controller associated with the memory and the plurality of random access memory devices;

receiving, by the controller from the memory, information associated with the test configuration for built-in self-test;

programming, by the plurality of random access memory devices, the plurality of programmable logic devices based on at least information associated with the test configuration for built-in self-test;

providing at least an input to the programmed plurality of programmable logic devices;

detecting at least an output from the programmed plurality of programmable logic devices in response to at least the input;

comparing the detected output and a predetermined output;

determining whether a circuit failure exists for the packaged integrated circuit system based on at least a result from the process for comparing the detected output and a predetermined output;

if a circuit failure is determined to exist, repairing the circuit failure;

wherein:
  the process for repairing the circuit failure includes activating the redundant circuit associated with the polysilicon fuse and deactivating a defective circuit associated with the circuit failure;
  the process for activating the redundancy circuit and deactivating the defective circuit includes providing a repair voltage to the polysilicon fuse and changing a conductivity state of the polysilicon fuse from a first state to a second state;
  the repair voltage is less than or equal to the highest operation voltage of the packaged integrated circuit system.

2. The method of claim 1 wherein the repair voltage is less than or equal to 3.3 volts.

3. The method of claim 1 wherein the process for repairing the circuit failure is performed without using a laser beam.

4. The method of claim 1 wherein the process for receiving information associated with the test configuration for built-in self-test, the process for programming the plurality of programmable logic devices, the process for providing at least an input, the process for detecting at least an output, the process for comparing the detected output and a predetermined output, the process for determining whether a circuit failure exists, and the process for repairing the circuit failure are performed in the field.

* * * * *